(12) United States Patent
Burger

(10) Patent No.: US 7,242,599 B2
(45) Date of Patent: Jul. 10, 2007

(54) SELF-ANALYZING MEMORY WORD

(76) Inventor: John Robert Burger, 10115 Jordan Ave., Chatsworth, CA (US) 91311

( * ) Notice: Subject to any disclaimer, the term of this patent is extended or adjusted under 35 U.S.C. 154(b) by 21 days.

(21) Appl. No.: 10/907,967

(22) Filed: Apr. 22, 2005

(65) Prior Publication Data

US 2006/0239053 A1 Oct. 26, 2006

(51) Int. Cl.
*G11C 15/00* (2006.01)

(52) U.S. Cl. .................. 365/49; 365/154; 711/108

(58) Field of Classification Search .............. 365/49, 365/185.09, 221, 201, 154; 711/3, 5, 104.1, 711/6, 108
See application file for complete search history.

(56) References Cited

U.S. PATENT DOCUMENTS

| | | | | |
|---|---|---|---|---|
| 4,996,666 A | * | 2/1991 | Duluk, Jr. ..................... | 365/49 |
| 5,357,458 A | * | 10/1994 | Yu et al. ........................ | 365/49 |
| 5,438,535 A | | 8/1995 | Lattibeaudiere .............. | 365/49 |
| 5,758,148 A | | 5/1998 | Lipovski ........................ | 707/6 |
| 6,316,962 B1 | * | 11/2001 | Kwon ........................... | 326/113 |
| 6,711,558 B1 | | 3/2004 | Indeck .......................... | 707/1 |
| 2002/0048059 A1 | * | 4/2002 | Azuma ........................ | 359/107 |
| 2005/0110106 A1 | * | 5/2005 | Goto et al. .................. | 257/432 |

FOREIGN PATENT DOCUMENTS

JP 405120319 A * 4/1993

* cited by examiner

*Primary Examiner*—Richard T. Elms
*Assistant Examiner*—Douglas King

(57) ABSTRACT

A content-addressable memory stores a plurality of words, each word with intrinsic capability: Global bus-1 selects a set of bits in each word. Global bus-2 selects a disjoint set of bits in each word. Circuits approximately adiabatic in each word, toggle bus-2 bits if and only if all bus-1 bits are true. Toggling selectively, as above, will copy selected bits to new locations, and will calculate a given Boolean function on a given subset of bits. Each word, in parallel with other words, can thus accomplish any task that can be composed of bit-copying and Boolean operations. Every word systematically undergoes modification during each processing step without reading or writing to a global bus. This avoids an increase in processing time and loss of efficiency for global bus operations. Self-analyzing memory words support a programmable computer, massively parallel, logically reversible and approximately adiabatic.

10 Claims, 3 Drawing Sheets

Preferred Embodiment of a Reversible Circuit for a Self-analyzing Memory Word Cell.

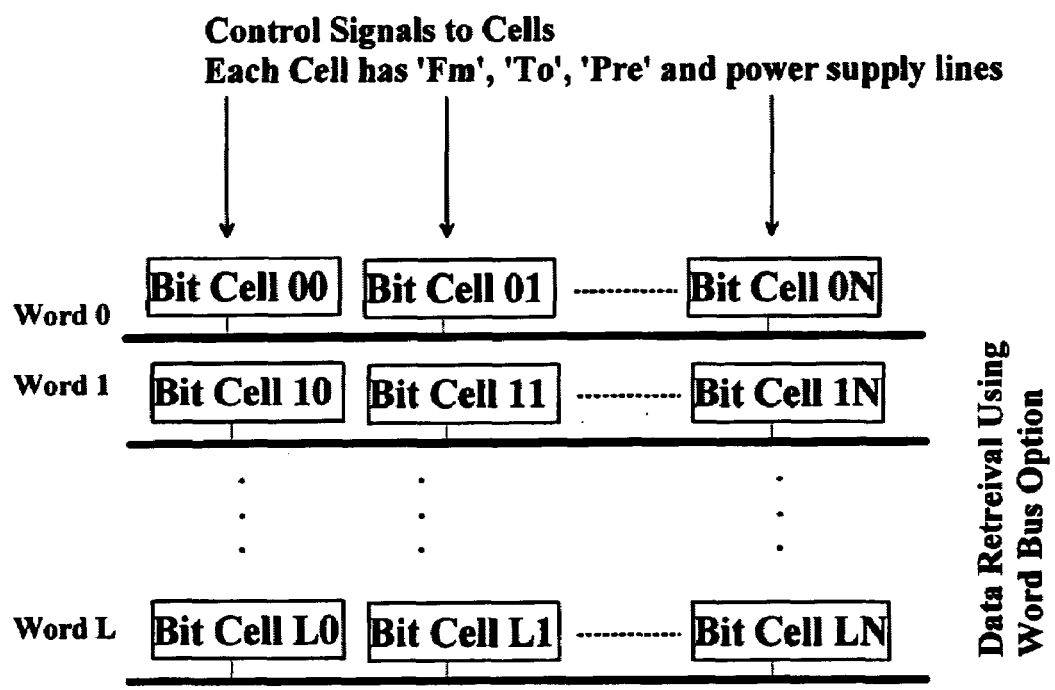
Figure 1  Architecture using Self-analyzing Memory Words.

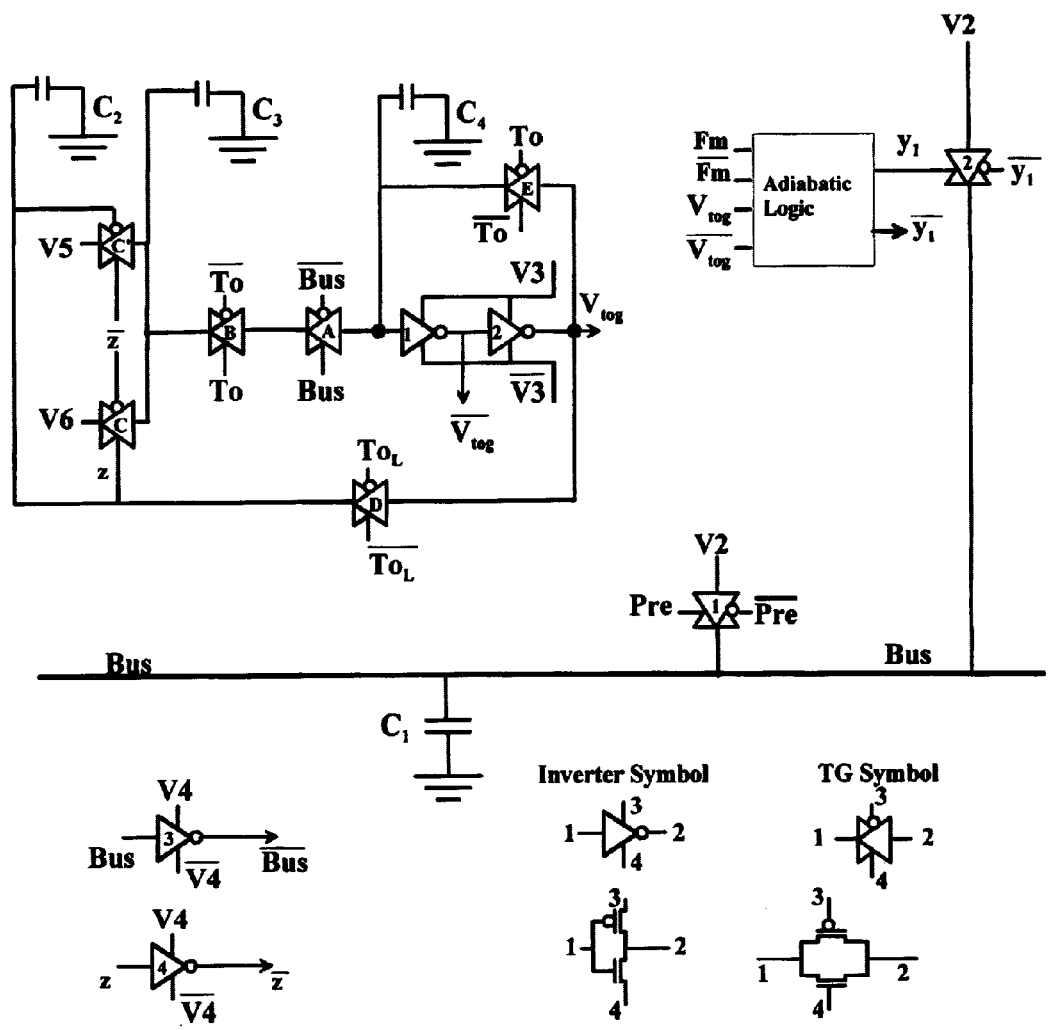
Figure 2  Preferred Embodiment of a Reversible Circuit for a Self-analyzing Memory Word Cell.

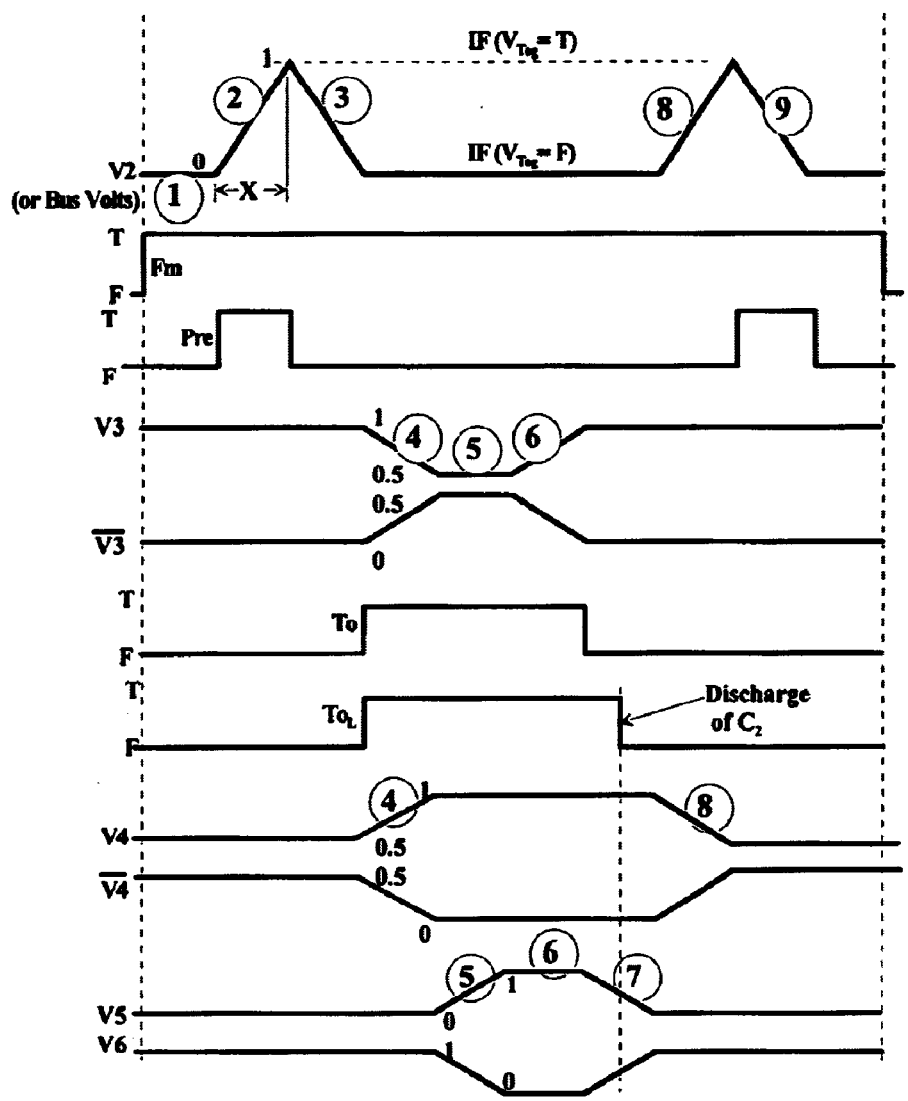
Figure 3   Power Supply Voltage and Logic Waveforms.

US 7,242,599 B2

SELF-ANALYZING MEMORY WORD

BACKGROUND OF THE INVENTION (NEW)

Self-analyzing memory words are a type of CAM or Content-addressable memory (US Patent Classification 365/49, Associative memories), and 711/108, Content addressable memory (CAM). Self-analyzing memory words can be constructed using a combination of CMOS pass transistor logic (326/113, Transmission gate logic) and CMOS logic (326/121, CMOS). Circuits are of the charge recovery type, that is, approximately adiabatic; they use pulsating power supplies with differing phases (326/96, Two or more clocks). Self-analyzing memory words are intended for massively parallel processing (708/507, Electrical digital calculating computer, parallel).

Content-addressable memory is well suited to the quick look up of an item in an unstructured table but it is poorly suited as a general purpose computer. Prior CAM depends on a global bus, so it suffers a major slowdown when there are multiple items to be read, modified, and re-written. Prior CAM art includes Lattibeaudiere, U.S. Pat. No. 5,438,535, 1995. Here each selected item must be prioritized, and then be read out using a global bus for this purpose. Unfortunately, bus usage is slow and dissipative of power, particularly when there are a very large number of selections. Thus it is impractical to perform parallel processing in which every word in memory is modified for every step of a given task.

Self-analyzing memory words use approximately adiabatic, logically reversible circuits. Prior art in logically reversible, approximately adiabatic logic applies, for example, to a fill adder, which is quite different from a CAM. Prior art includes switching between a forward and a reverse logic circuit, also quite different from the toggle-on/toggle-off memory cell approach of this disclosure.

BRIEF SUMMARY OF INVENTION

Self-analyzing memory words work as follows: Global bus-1, known as the 'from' bus selects a set of bits in each word. Global bus-2, known as the 'to' bus selects a second set of bits, disjoint to the first set, in each word. Circuits in each word toggle bus-2 bits if and only if all bus-1 bits are true. Also, as a trivial subset of the above, the above system can execute an unconditional toggle of any selected bus-2 bits. Thus results a logically reversible computer, because a second toggling can reverse any toggle.

Self-analyzing memory words can be comparable in physical size to static random access memory words. Self-analyzing memory words might be applied for the rapid look-up of data in a table, but they are intended for much more. Because of their ability to copy bits to new locations, and to implement a Boolean operation on selected word bits, they have Boolean capability. Boolean capability means that it is possible to implement a given procedure, such as binary division, within each word of the memory, without using a global bus for reading and writing. Millions of such operations, each with differing sets of operands in each word, may occur in parallel.

Self-analyzing memory words may be initialized to any binary count, making it easy to find a particular set of bits that activate a given function. This is essential for those difficult problems in which a function can be determined, but function inputs cannot. Self-analyzing memory words can easily evaluate a binary function in the sense that each entry in a truth table for the function may be calculated in parallel. Approximately adiabatic circuits are used. Self-analyzing memory words support a programmable computer, massively parallel, logically reversible and approximately adiabatic.

BRIEF DESCRIPTION OF DRAWINGS

FIG. 1 is a block diagram of a memory system using self-analyzing memory words.

FIG. 2 is an approximately adiabatic, logically reversible circuit for a cell of self-analyzing memory.

FIG. 3 presents waveforms needed for FIG. 2.

DETAILED DESCRIPTION OF INVENTION (NEW)

FIG. 1 shows an Architecture using Self-analyzing Memory Words. Words in each row are numbered from 0 to L; cells in each word are numbered from 0 to N. Each word has a local word bus, intended to be a conductor that charges and discharges between true and false.

Control lines, one bus for each column, make contact with each cell in a given column. Control lines labeled 'Fm', 'To', and 'Pre' conduct signals and their complements from the outside world into the memory system. Each cell has a memory state $V_{tog}$ to be used within a word.

To summarize, the word bus is charged to be true as enabled by a signal Pre. Given cells are selected by the signals Fm. The bus stays true if $V_{tog}$ are true while Fm are true. On the other hand, the bus goes false if any one $V_{tog}$ is false while Fm is true. Differing cells are selected by the To signals; if the word bus is true, a toggle is implemented in the cells that are selected by the To signals. Finally the signal Pre enables a discharge of the word bus.

FIG. 2 shows a Preferred Embodiment of a Reversible Circuit for a Self-analyzing Memory Word Cell. The goal is zero power dissipation at the location of this circuit. Simulation indicates that this goal is being achieved. The functions of FIG. 2 can be understood by referring to FIG. 3, Power Supply Voltage and Logic Waveforms. The power supply voltages will have rise and fall times, defined to be X, equal to a given fraction of a second.

Initially (in FIG. 3) Fm signals go true for selected cells, and Pre signals go true for each cell in the system. In FIG. 2 (on the right) the Boolean variable $y_1$ is computed using standard (charge recovery) logic:

$$y_1 = Fm V_{tog}'$$

$V_{tog}'$ is the complement of $V_{tog}$. Consequently, if Fm is true and if $V_{tog}$ is false, the output $y_1$ is true.

In the region labeled 2 in FIG. 3, the bus power supply voltage V2 moves slowly from 0 to 1. A one-volt power supply is assumed. Since Pre is true, the word bus charges to 1 volt mainly through TG 1.

At the end of region 2, Pre goes low. Then, in region 3, the bus discharges the word bus through TG 2 if and only if $V_{tog}$ is false while Fm is true. Otherwise, the word bus stores charge in $C_1$, the bus stray capacitance. The logic level on the bus is denoted by Bus. The logic level must be held in $C_1$ for a time until V2 again goes high.

In another cell of the word, a signal initiates toggling at the end of region 3. To and $TO_L$ go high to select candidate cells for toggling. While $TO_L$ is false, the voltage on $C_2$ follows $V_{tog}$ but when $TO_L$ goes high, this voltage is trapped in $C_2$, because the transmission gate at location D becomes open. The logic on $C_2$ is denoted by z; it must hold its logic for a time until $TO_L$ goes low again. When To goes high, transmission gate B become conducting, and flip flops in the system, each consisting of two cross-coupled inverters 1, 2 in FIG. 2, are unlatched at transmission gate E. The cross-coupling is opened to permit toggling, if toggling is called for.

The toggle begins in region 4 when power supply voltage V3, which is split-level, deactivates the two inverters that generate $V_{tog}$. Note that Fm is assumed false where To is true, so $V_{tog}$ does not affect the bus logic. Note also that when To is true in a particular cell, $V_{tog}$ is held temporarily in capacitor $C_4$ for a time until V3 activates again, and To goes low again. Concurrently, in region 4, voltage V4, which is split level, enables a reliable calculation of the complements of Bus and z.

Power supply voltages V5 and V6 accomplish reversible toggling. V5 is connected if z=0, and V6 is connected if z=1. Immediately after To goes high, there is NO voltage difference across the transmission gates at gates A, B and C. But as V5 and V6 change states in region 5, the gates at location C permit the passage of the appropriate voltage to change the state of capacitance $C_4$. After this, in region 6, the two inverters generating $V_{tog}$ are activated (V3 is returned to full voltage). At the end of region 6, the To signals go low, and the new state is latched by TG E in FIG. 2. In region 7 the toggle voltages V5 and V6 are restored to their original states. At the end of region 7 the $TO_L$ signals go low, effectively reversing the charge on $C_2$ so that $z=V_{Tog}$. In region 8 the power supply voltage V4 can be safely deactivated (returned to 0.5 V).

Note that if no Fm are true, the bus remains charged; in this case, toggling is unconditional when To is true.

At the end of the cycle for cell processing, V2 again goes high in region 8; if Fm is true and the selected $V_{tog}$ are false, the word bus follows V2 up to one volt. If the selected $V_{tog}$ is true, the word bus is already near one volt at the end of region 8. The Pre signal again goes true at the beginning of region 9, thus permitting an unconditional discharge of the word bus. V2 slowly discharges down to zero in region 9, thus leaving the bus with no charge, ready for another operation.

This circuit is approximately adiabatic, as close as possible in a practical electronic system, because significant charge can be recovered in the limit of long X, assuming no leakage resistances. One exception is capacitor $C_2$ that holds the previous state of $V_{tog}$. Its charge is dissipated irreversibly when the $TO_L$ signal returns to a false value. The energy dissipated from $C_2$ is insignificant because $C_2$ is very small, and because typically only one cell is toggled in a system with a great many cells.

By applying an appropriate sequence of 'Fm' and 'To' selections, a Boolean operation can be implemented on any subset of bits in each word. For example, consider a single word as an example for the purposes of explaining a self-analyzing memory word. Assume a word holds: $a_7a_6a_5a_4, a_3a_2a_1a_0$=1010, 1110; assume we want the Boolean function AND $[a_7(a_6)'a_5(a_4)'a_3a_2a_1]$; we want to indicate the result by toggling $a_0$. The procedure is: (1) unconditionally complement $a_6$ and $a_4$; (2) toggle $a_0$ if and only if all bits in positions 1-7 are true. (3) Finally, if desired, bits 1-7 may be restored by a second unconditional complement of $a_6$ and $a_4$. The result of the operation is $a_0$=1 and $a_7a_6a_5a_4, a_3a_2a_1a_0$=1010, 1111.

Also of interest is bit-copying. As an example for the purposes of explaining a self-analyzing memory word, assume a word holds $a_7a_6a_5a_4, a_3a_2a_1a_0$=1010, 0000; the first half of the word, 1010, may be 'copied' into the second half one bit at a time. Since $a_7$ is 1, toggle $a_3$ to be 1; since $a_6$ is 0, $a_2$ will not toggle; since $a_5$ is 1, toggle $a_1$ to 1; since $a_4$ is 0, $a_0$ will not toggle. Thus the result is $a_7a_6a_5a_4, a_3a_2a_1a_0$=1010, 1010, and the first half is effectively copied into the second half.

Self-analyzing memory words might be applied for the rapid look-up of data in a table, which is nothing new, but they are intended for much more. Because of their ability to copy bits to new locations, and to implement a Boolean operation on selected word bits, they have Boolean capability. Boolean capability means that it is possible to implement a given procedure, such as binary division, within each word of the memory, without using a global bus for reading and writing. Millions of such operations, each with differing sets of operands in each word, may occur in parallel, and may accomplish what has been termed 'vector' processing.

Beyond arithmetic, sometimes it happens that the solution to a problem can be expressed as finding an arrangement of bits that satisfies a known Boolean function. To find the solution when N bits are involved, use $2^N$ words, each with at least N+1 bits. Initialize the first N bits to binary counts from 0 to $2^N-1$. Since the words have Boolean capability, and the Boolean function is known, it may be applied to each count. This will determine which of the $2^N$ binary combinations makes the function true. The result may be placed in bit N+1. In effect, a Boolean function can be evaluated directly, as though it were calculated in a truth table.

The advantage of self analyzing memory words over prior CAM is that read and write operations using a global bus are unnecessary to change the contents of the words. Prior CAM cannot toggle without reading and writing using a global bus, since each toggle would require a global bus operation. For an exponentially large number of words, there are going to be an exponentially large number of bus operations. Each bus operation accumulates an increase in time delay and an unintended loss of electrical energy and power. Prior CAM cannot handle an exponentially large number of bus operations, and would perform poorly under such conditions.

Self-analyzing memory words need to be initialized to hold binary information. One option for initialization is a system of multi-write as in prior CAM. This requires the addition of a data-input bus that would be used only once for initialization, and would not be used during processing, to avoid inefficiency. Alternately, build-in transistors (not shown) can be used to set and clear the toggles, to initialize each word to a unique binary count.

After a processing procedure, the desired results need to be read. One option for readout is a system of multi-read as in prior CAM. Many applications do not need to know the entire word, in which case only a small subset of a word is read. This requires a data-output bus that would be used only once, to provide the final result, and would not be used during processing, to avoid inefficiency. Alternatively, as in prior CAM, the word buses can be employed directly. For example, the locations of true word lines could be the information of interest. This location can be determined by judiciously shifting out the bus truth-values, without attempting readout of memory.

The electronics for each word in Burger's invention is specified to be electrically reversible, and approximately adiabatic; that is, approximately zero power will be dissipated at the location of the subject circuit. Requirements are: slow increases and decreases in power supply voltages, and very low shunt conductance to reduce loss. A very small amount of power will be dissipated by $C_2$ for each toggle operation, so obviously the value of $C_2$ should be as small as possible.

In order to minimize power dissipation, power-clocking rates must be low, below 1 MHz. Thus, in order to be useful, this logic must be part of a massively parallel computer. Self-analyzing memory words support a massively parallel computer, logically reversible and approximately adiabatic.

What is claimed is:

1. A content addressable memory comprising:
   a plurality of cells arranged in rows and columns, the cells in each row constituting a self-analyzing memory word capable of storing a plurality of data bits;
   a plurality of local word buses, each connectable to a self-analyzing memory word;
   a first control bus configured to select a first set of cells comprising cells from each self-analyzing memory word;
   a second control bus configured to select a second disjoint set of cells comprising cells from each self-analyzing memory word;
   a third control bus connectable to each cell and configured to enable toggles of the second set cells;
   wherein each self-analyzing memory word comprises circuitry that is logically reversible, approximately adiabatic and configured to perform a micro-operation on the cells that constitute the self-analyzing memory word such that the bit values of cells from the second set are toggled if and only if all bit values of cells found in the first set are true; and
   wherein the logically reversible circuitry comprises a toggle circuit comprising a capacitor configured to sample the current state of each cell and allow a complement of the sampled state to become established within the cell; and
   wherein all of the circuitry in each cell is asymptotically adiabatic except for the capacitor circuit that is configured to sample the current state of each cell.

2. The content addressable memory of claim 1, wherein the first and second control buses are configured to communicate a user defined procedure without requiring reading from or writing to the cells via a global data bus.

3. The content addressable memory of claim 2, wherein the user defined procedure is a series of micro-operations specifying a bit-copying operation.

4. The content addressable memory of claim 2, wherein the user defined procedure is a series of micro-operations specifying a Boolean evaluation.

5. The content addressable memory of claim 2, wherein the user defined procedure is a computation involving each word in parallel.

6. A parallel computer comprising a content addressable memory comprising:
   a plurality of cells arranged in rows and columns, the cells in each row constituting a self-analyzing memory word capable of storing a plurality of data bits;
   a plurality of local word buses, each connectable to a self-analyzing memory word;
   a first control bus configured to select a first set of cells comprising cells from each self-analyzing memory word;
   a second control bus configured to select a second disjoint set of cells comprising cells from each self-analyzing memory word;
   a third control bus connectable to each cell and configured to enable toggles of the second set cells;
   wherein each self-analyzing memory word comprises circuitry that is logically reversible, approximately adiabatic and configured to perform a micro-operation on the cells that constitute the self-analyzing memory word such that the bit values of cells from the second set are toggled if and only if all bit values of cells found in the first set are true; and
   wherein the logically reversible circuitry comprises a toggle circuit comprising a capacitor configured to sample the current state of each cell and allow a complement of the sampled state to become established within the cell; and
   wherein all of the circuitry in each cell is asymptotically adiabatic except for the capacitor circuit that is configured to sample the current state of each cell.

7. The parallel computer of claim 6, wherein the first and second control buses are configured to communicate a user defined procedure without requiring reading from or writing to the cells via a global data bus.

8. The parallel computer of claim 7, wherein the user defined procedure is a series of micro-operations specifying a bit-copying operation.

9. The parallel computer of claim 7, wherein the user defined procedure is a series of micro-operations specifying a Boolean evaluation.

10. The parallel computer of claim 7, wherein the user defined procedure is a computation involving each word in parallel.

* * * * *